(12) United States Patent
Barve et al.

(10) Patent No.: US 9,742,153 B1
(45) Date of Patent: Aug. 22, 2017

(54) COMPACT EMITTER DESIGN FOR A VERTICAL-CAVITY SURFACE-EMITTING LASER

(71) Applicant: Lumentum Operations LLC, Milpitas, CA (US)

(72) Inventors: Ajit Vijay Barve, San Jose, CA (US); Albert Yuen, Palo Alto, CA (US)

(73) Assignee: Lumentum Operations LLC, Milpitas, CA (US)

( * ) Notice: Subject to any disclaimer, the term of this patent is extended or adjusted under 35 U.S.C. 154(b) by 0 days.

(21) Appl. No.: 15/050,817

(22) Filed: Feb. 23, 2016

(51) Int. Cl.
*H01S 5/20* (2006.01)
*H01S 5/183* (2006.01)
*H01S 5/42* (2006.01)

(52) U.S. Cl.
CPC .......... *H01S 5/18311* (2013.01); *H01S 5/423* (2013.01)

(58) Field of Classification Search
CPC . H01S 5/423; H01S 5/426; H01S 3/08; H01S 5/18313
USPC ....................................................... 372/45.01
See application file for complete search history.

(56) References Cited

U.S. PATENT DOCUMENTS

| | | | |
|---|---|---|---|
| 5,881,085 A | 3/1999 | Jewell | |
| 6,304,588 B1 * | 10/2001 | Chua | B82Y 20/00 372/46.013 |
| 2001/0043629 A1 * | 11/2001 | Sun | H01S 5/426 372/43.01 |
| 2004/0165636 A1 * | 8/2004 | Ezaki | H01S 5/18313 372/46.013 |
| 2009/0161713 A1 * | 6/2009 | Duggan | B82Y 20/00 372/45.01 |

OTHER PUBLICATIONS

Wikipedia, "Vertical cavity surface emitting laser", https://en.wikipedia.org/wiki/Vertical-cavity_surface-emitting_laser, Nov. 3, 2015, 6 pages.

* cited by examiner

*Primary Examiner* — Tuan Nguyen
(74) *Attorney, Agent, or Firm* — Harrity & Harrity, LLP (57) ABSTRACT

A surface emitting laser may include an isolation layer including a first center portion and a first plurality of outer portions extending from the first center portion, and a metal layer including a second center portion and a second plurality of outer portions extending from the second center portion. The metal layer may be formed on the isolation layer such that a first outer portion, of the second plurality of outer portions, is formed over one of the first plurality of outer portions. The surface emitting laser may include a passivation layer including a plurality of openings. An opening may be formed over the first outer portion. The surface emitting laser may include a plurality of oxidation trenches. An oxidation trench may be positioned at least partially between the first outer portion and a second outer portion of the second plurality of outer portions.

20 Claims, 6 Drawing Sheets

COMPACT EMITTER DESIGN FOR A VERTICAL-CAVITY SURFACE-EMITTING LASER

TECHNICAL FIELD

The present disclosure relates generally to lasers and, more particularly, to a compact emitter design associated with a vertical-cavity surface-emitting laser (VCSEL).

BACKGROUND

A vertical-emitting device, such as a vertical-cavity surface-emitting laser (VCSEL), is a laser in which a laser beam is emitted in a direction parallel a surface of a substrate (e.g., vertically from a surface of a semiconductor wafer). Contrary to edge-emitting devices, vertical-emitting devices may allow for testing to occur at intermediate steps of wafer fabrication.

SUMMARY

According to some possible implementations, a vertical cavity surface emitting laser (VCSEL) may include: an implant isolation layer including a circular portion with a first radius and a first plurality of extended portions extending from a circumference of the circular portion; a P-Ohmic metal layer including a ring portion with a second radius and a second plurality of extended portions extending from a circumference of the ring portion, where the P-Ohmic metal layer may be formed on the implant isolation layer such that the second plurality of extended portions is positioned over the first plurality of extended portions of the implant isolation layer; a plurality of dielectric via openings formed on a dielectric via layer, where a dielectric via opening, of the plurality of dielectric via openings, may be positioned over a first extended portion, of the first plurality of extended portions, and a first extended portion of the second plurality of extended portions; and a plurality of oxidation trenches, where an oxidation trench, of the plurality of oxidation trenches, may be positioned at least partially between the first extended portion, of the first plurality of extended portions, and a second extended portion of the first plurality of extended portions.

According to some possible implementations, a surface emitting laser may comprise: an isolation layer including a first center portion and a first plurality of outer portions extending from a circumference of the first center portion; a metal layer including a second center portion and a second plurality of outer portions extending from a circumference of the second center portion, where the metal layer may be formed on the isolation layer such that a first outer portion, of the second plurality of outer portions, is formed over one of the first plurality of outer portions; a passivation layer including a plurality of openings, where an opening, of the plurality of openings, may be formed over the first outer portion of the second plurality of outer portions; and a plurality of oxidation trenches, where an oxidation trench, of the plurality of oxidation trenches, may be positioned at least partially between the first outer portion, of the second plurality of outer portions, and a second outer portion of the second plurality of outer portions, where the first outer portion may be adjacent to the second outer portion.

According to some possible implementations, a laser array may comprise: a plurality of vertical cavity surface emitting lasers (VCSELs), each of the VCSELs having an oxidation aperture size of approximately six micrometers to fourteen micrometers.

DETAILED DESCRIPTION

The following detailed description of example implementations refers to the accompanying drawings. The same reference numbers in different drawings may identify the same or similar elements. The implementations described below are merely examples and are not intended to limit the implementations to the precise forms disclosed. Instead, the implementations were selected for description to enable one of ordinary skill in the art to practice the implementations.

Multiple vertical-emitting devices may be arranged to form an array. For example, multiple vertical-emitting devices (herein referred to as emitters) may be arranged to form a VCSEL array, such as a grid VCSEL array (e.g., where multiple emitters are uniformly spaced and oxidation trenches may be shared by two or more emitters), a non-grid VCSEL array (e.g., where multiple emitters are not uniformly spaced and each emitter requires a set of oxidation trenches which may or may not be shared), or the like.

One factor when designing a VCSEL array is a density of emitters within the VCSEL array. Increasing the density of emitters within the VCSEL array (i.e., reducing space between the emitters) may allow for a reduction in a size and/or a reduction in cost of an integrated circuit (IC) on which the VCSEL array is constructed (e.g., while achieving a same power output as a VCSEL array without reduced spacing). For a non-grid VCSEL array (e.g., where the emitters are arranged at non-uniform distances and/or angles with respect to each other) that includes emitters of a prior design (hereinafter referred to as "prior emitters"), each emitter may need a separate set of oxidation trenches. This may introduce a limit on minimum spacing between emitters of the VCSEL array (e.g., for a given set of design rules associated with manufacturing the VCSEL array), thereby limiting the density of the non-grid VCSEL array.

One technique by which the spacing between the emitters in the non-grid VCSEL array may be reduced is by decreasing widths of one or more emitter layers, such as a trench layer (i.e., a set of oxidation trenches), a P-Ohmic metal layer, a dielectric via opening, or the like. However, such a reduction may be difficult and/or impossible due to fabrication limitations associated with manufacturing the emitters and/or design considerations associated with the emitters.

Implementations described herein may provide a compact emitter design that may allow spacing between emitters of a VCSEL array to be reduced (e.g., as compared to a prior emitter design), thereby allowing for increased emitter density within the VCSEL array (e.g., as compared to a VCSEL array using prior emitters). Moreover, the compact emitter design may allow for increased emitter density while achieving a same level of performance as compared to the prior emitter design. In other words, the compact emitter design allows for the size of emitters, included in the VSCEL array, to be reduced without sacrificing performance (e.g., in terms of an output power, wavelength, emission profile, reliability, etc.) as compared to the prior emitter design.

In some implementations, the reduction in emitter spacing may be achieved by using a split architecture for one or more emitter layers, such as a P-Ohmic metal layer (e.g., a metal layer), an implant isolation layer (e.g., formed by an isolation material), a dielectric via opening, or the like. The split architecture may allow spaces between oxidation trenches to be utilized by causing the one or more emitter layers (e.g., the P-Ohmic metal layer and the dielectric via opening) to be interdigitized with the oxidation trenches (e.g., such that extended portions of the one or more layers lie partially between respective oxidation trenches, as shown in FIG. 1B). Due to the utilization of the spaces between the oxidation trenches, a size of the emitter may be reduced (e.g., by approximately 20% as compared to a prior emitter design), thereby allowing for increased emitter density in a non-grid VCSEL array.

Moreover, alignment tolerances between emitter layers and/or minimum widths of the emitter layers may not be affected by use of the split architecture, which may prevent manufacturing and/or design considerations, associated with the emitter, from being impacted. In other words, widths of and/or spacing between emitter layers may be the same as corresponding widths and spacing of the prior emitter design. This may allow the compact emitter design to have performance characteristics that match performance characteristics of the prior emitter design, as described above, while allowing a size of the emitter to be reduced and an array density to be increased.

Figure 1A:
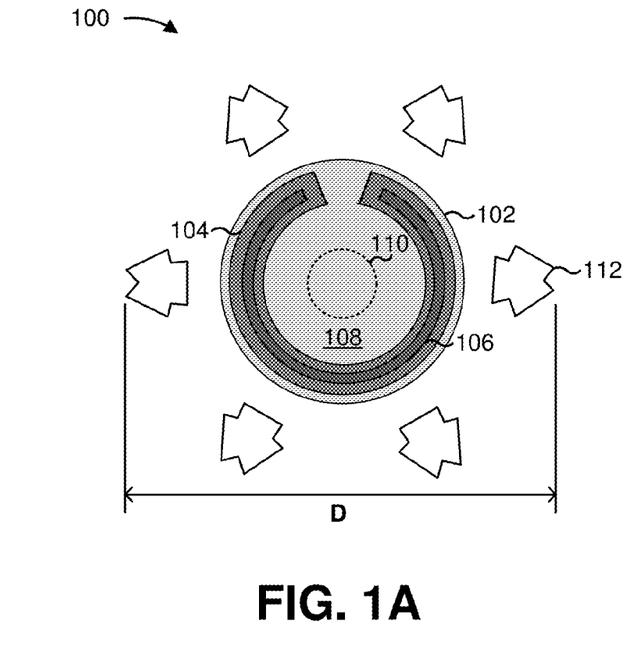
FIGS. 1A and 1B are diagrams depicting top-views of a design for an emitter and an example design for a compact emitter.
Figure 1B:
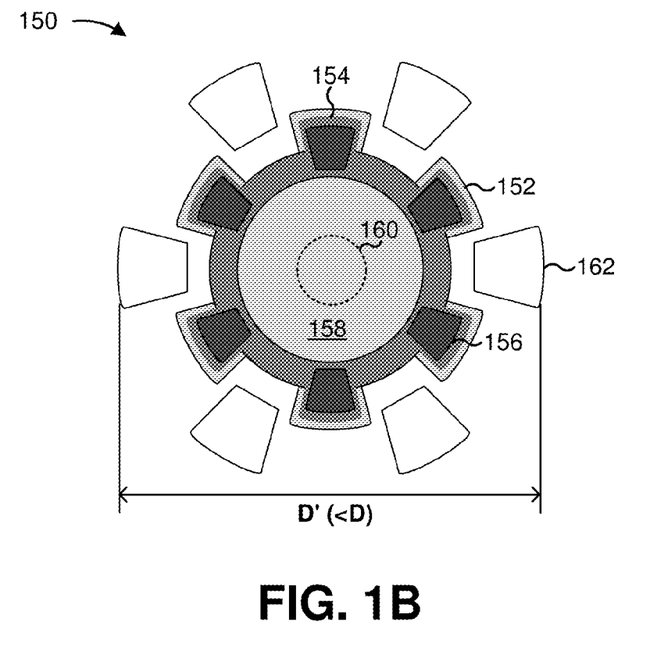

FIGS. 1A and 1B are diagrams depicting top-views of a design for an emitter 100 (e.g., a prior emitter design) and a design for an example compact emitter 150, respectively. As shown in FIG. 1A, emitter 100 may include a set of emitter layers constructed in a typical emitter architecture. For purposes of clarity, not all emitter layers of emitter 100 are shown in FIG. 1A.

As shown by the light gray area in FIG. 1A, emitter 100 includes an implant isolation layer 102 that is circular in shape. Implant isolation layer 102 is defined based on a space between sections of implant material included in emitter 100 (not shown). As shown by the medium gray area in FIG. 1A, emitter 100 includes a P-Ohmic metal layer 104 that is constructed in a partial ring-shape (e.g., with an inner radius and an outer radius). As shown, P-Ohmic metal layer 104 is positioned concentrically over implant isolation layer 102 (i.e., the outer radius of P-Ohmic metal layer 104 is less than a radius of implant isolation layer 102).

As shown by the dark gray area of FIG. 1A, emitter 100 includes a dielectric via opening 106 that is formed (e.g., etched) on a dielectric passivation/mirror layer that covers P-Ohmic metal layer 104 (not shown). As shown, dielectric via opening 106 is formed in a partial ring-shape (e.g., similar to P-Ohmic metal layer 104) and is formed concentrically over P-Ohmic metal layer 104 such that metallization of the dielectric passivation/mirror layer contacts P-Ohmic metal layer 104. In some implementations, dielectric opening 106 and/or P-Ohmic metal layer may be formed in another shape, such as a full ring-shape or a split ring-shape.

As further shown, emitter 100 includes an optical aperture 108 in a portion of the emitter within the inner radius of the partial ring-shape of P-Ohmic metal layer 104. Emitter 100 emits a laser beam via optical aperture 108. As further shown, emitter 100 also includes an oxidation aperture 110 (e.g., formed by an oxidation layer of emitter 100 (not shown)). Oxidation aperture 110 is formed below optical aperture 108.

As shown by the white polygons in FIG. 1A, emitter 100 includes a set of oxidation trenches 112 that are spaced (e.g., equally) around a circumference of implant isolation layer 102. As shown, an overall width of emitter 100, from an outer edge of an oxidation trench 112 to an outer edge of an oppositely positioned oxidation trench 112, is a width D (e.g., 40.0 micrometers (μm)). How close oxidation trenches 112 can be positioned relative to the optical aperture 108 is limited by implant isolation layer 102, P-Ohmic metal layer 104, dielectric via opening 106, and manufacturing tolerances. Because layers 102, 104 and 108 are circular in shape while oxidation trenches 112 are not, emitter 100 includes unused space between oxidation trenches 112.

As shown in FIG. 1B, compact emitter 150 may use a split architecture or interdigitized design in order to reduce an overall size (e.g., as compared to emitter 100). As shown by the light gray areas in FIG. 1B, compact emitter 150 may include implant isolation layer 152 that includes a circular portion (e.g., a circular portion that has a smaller radius than implant isolation layer 102 of emitter 100) and a set of partial ring-shaped extended portions (e.g., shaped as a set of "teeth" extending from and spaced around a circumference of the circular portion, for example a cog wheel shape). In some implementations, implant isolation layer 152 may be defined based on sections of isolation material included in compact emitter 150 (not shown).

As shown by the medium gray areas in FIG. 1B, compact emitter 150 may include P-Ohmic metal layer 154 that includes a ring portion (e.g., with an inner radius and an outer radius) and a set of partial ring-shaped extended portions (e.g., shaped as a set of "teeth extending from and spaced around an outer circumference of the ring portion, for example a cog wheel shape with a hollow center). As shown, the extended portions of P-Ohmic metal layer 154 may overlap the extended portions of implant isolation layer 152.

As shown by the dark gray areas of FIG. 1B, compact emitter 150 may include a set of dielectric via openings 156 that are formed on a dielectric passivation/mirror layer (not shown), and arranged as multiple disconnected openings over the extended portions of P-Ohmic metal layer 154. As shown, dielectric via openings 156 may be formed in partial ring-shapes (e.g., similar to the extended portions of P-Ohmic metal layer 154, for example disconnected concentric arcuate segments and must be at least partially positioned over P-Ohmic metal layer 154 such that metallization may contact P-Ohmic metal layer 154 via dielectric via openings 156.

As further shown, compact emitter 150 may include an optical aperture 158 in a portion of the emitter within the inner radius of the partial ring-shape of P-Ohmic metal layer 154. Compact emitter 150 may emit a laser beam via optical aperture 158. As further shown, Compact emitter 150 may also include an oxidation aperture 160 (e.g., formed by an oxidation layer of compact emitter 150 (not shown)). Oxidation aperture 160 may be formed below optical aperture 158, as described elsewhere herein. Notably, the size of oxidation aperture 160 of compact emitter 150 may be the same as the size of oxidation aperture 110 of emitter 100. In other words, even with the reduced size of compact emitter 150, oxidation aperture 160 may not be reduced in size. Similarly, the inner radius of P-Ohmic metal layer 154 may the same as the inner radius of P-Ohmic metal layer 104 of emitter 100. As described elsewhere herein, maintaining such widths and spacing may allow compact emitter 150 to match a performance of emitter 100.

As shown by the white polygons or disconnected concentric arcuate segments in FIG. 1B, compact emitter 150 may include a set of oxidation trenches 162 (e.g., each of a partial ring-shape) that are positioned partially between dielectric via openings 156, the extended portions of P-Ohmic metal layer 154, and the extended portions of implant isolation layer 152. While oxidation trenches 162 are shown as being formed in a partial ring-shape, in some implementations, oxidation trenches may be formed in another shape, such as the irregular polygon shape of oxidation trenches 112. As shown, an overall width of compact emitter 150, from an outer edge of an oxidation trench 162 to an outer edge of an oppositely positioned oxidation trench 162, is a width D'. In some implementations, the width D' is less than 40 micrometers (μm) (i.e., the width D of emitter 100). In some implementations, the width D' is less than 35 μm. In some implementations, the width D' is approximately 32.4 μm.

By allowing spaces between oxidation trenches 162 to be utilized, the split architecture of compact emitter 150 may result in a reduction in overall size (e.g., as compared to emitter 100). For example, the overall width of compact emitter 150 may be 7.6 μm smaller (e.g., 40.0 μm–32.4 μm=7.6 μm), or approximately 20% smaller, than the overall width of emitter 100 (e.g., [(40.0 μm–32.4 μm)/40 μm]× 100%=19%). This increases emitter density when used in a non-grid VCSEL array, thereby reducing a size and/or a cost of an IC on which the non-grid VCSEL array is constructed.

Notably, alignment tolerances and/or minimum widths of the emitter layers may not be altered with compact emitter 150, which may minimize or eliminate any impact to manufacturing and/or design considerations. For example, a spacing between an outer edge of dielectric via opening 156 and an outer edge of P-Ohmic metal layer 154 (e.g., on a particular "tooth") may be the same as (or more than) a minimum width of one or more corresponding layers of emitter 100. As another example, a size of oxidation aperture 160 of compact emitter 150 may match a size of oxidation aperture 110 of emitter 100. This may allow performance characteristics (e.g., power, wavelength, emission profile, reliability) of compact emitter 150 to match performance characteristics of an equivalent emitter of prior emitter design 100, while reducing a size of compact emitter 150 (e.g., as compared to emitter 100).

The number and arrangement of layers shown in FIG. 1B are provided as an example. In practice, compact emitter 150 may include additional layers, fewer layers, different layers, or differently arranged layers than those shown in FIG. 1B. For example, while compact emitter 150 includes a set of six oxidation trenches 162 (and the emitter layers of compact emitter 150 are constructed accordingly), in practice, other designs are possible, such as a compact emitter that includes five oxidation trenches 162, seven oxidation trenches 162, or the like. As another example, while compact emitter 150 is a circular emitter design, in practice, other designs are possible, such as a rectangular emitter, an elliptical emitter, or the like. Additionally, or alternatively, the oxidation trenches 162 and corresponding "teeth" of the other layers may be unevenly spaced. Additionally, or alternatively, a set of layers (e.g., one or more layers) of compact emitter 150 may perform one or more functions described as being performed by another set of layers of compact emitter 150, respectively.

Notably, while the design of compact emitter 150 is described as including a VSCEL, other implementations are possible. For example, the design of compact emitter 150 may apply in the context of another type of optical device, such as a light emitting diode (LED), or another type of vertical emitting (e.g., top emitting or bottom emitting) optical device. Additionally, the design of compact emitter 150 may apply to emitters of any wavelength, power level, emission profile or the like. In other words, compact emitter 150 is not particular to an emitter with a given performance characteristic.

Figure 2A:
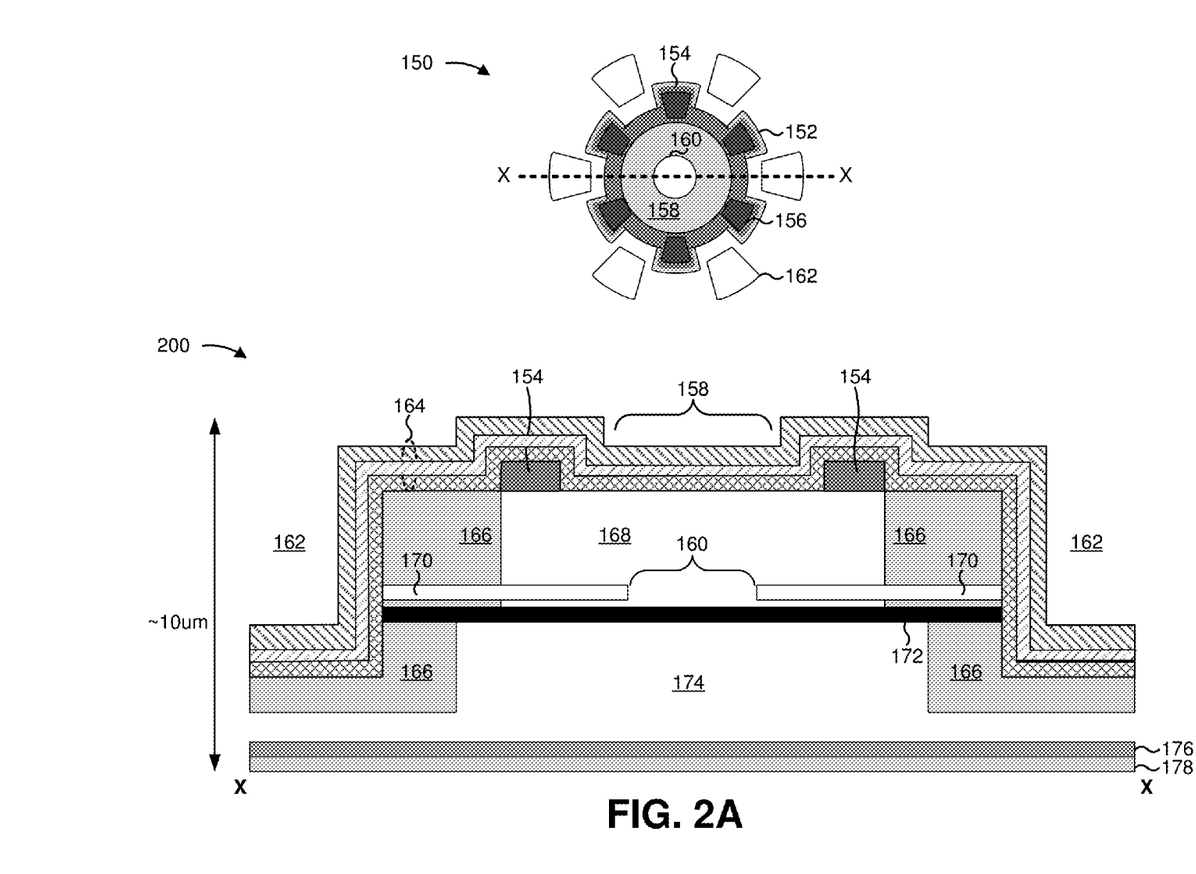
FIGS. 2A and 2B are diagrams depicting cross-sectional views of example compact emitters described herein.

As shown in FIG. 2A, cross-sectional view 200 may represent a cross-section of compact emitter 150 that passes through a pair of oxidation trenches 162 (e.g., as shown by the line labeled "X-X"). As shown, compact emitter 150 may include a backside cathode layer 178, a substrate layer 176, a bottom mirror 174, an active region 172, an oxidation layer 170, a top mirror 168, isolation material 166, dielectric passivation/mirror layer 164, and P-Ohmic metal layer 154. As shown, compact emitter 150 may have a total height that is approximately 10 μm.

Backside cathode layer 178 may include a layer that makes electrical contact with substrate layer 176. For example, backside cathode layer 178 may include an annealed metallization layer, such as a AuGeNi layer, a PdGeAu layer, or the like.

Substrate layer 176 may include a base substrate layer upon which epitaxial layers are grown. For example, substrate layer 176 may include a semiconductor layer, such as a GaAs layer, an InP layer, or the like.

Bottom mirror 174 may include a bottom reflector layer of compact emitter 150. For example, bottom mirror 174 may include a distributed Bragg reflector (DBR).

Active region 172 may include a layer that confines electrons and defines an emission wavelength of compact emitter 150. For example, active region 172 may be a quantum well.

Oxidation layer 170 may include an oxide layer that provides optical and electrical confinement of compact emitter 150. In some implementations, oxidation layer 170 may be formed as a result of (e.g., wet) oxidation of an epitaxial layer. For example, oxidation layer 170 may be an $Al_2O_3$ layer formed as a result of oxidation of an AlAs or an AlGaAs layer. Oxidation trenches 162 may include openings that allows oxygen (e.g., dry oxygen, wet oxygen) to access the epitaxial layer from which oxidation layer 170 is formed. Oxidation aperture 160 may include an optically active aperture defined by oxidation layer 170. A width of oxidation aperture 160 may range, for example, from approximately 6.0 μm to approximately 14.0 μm.

Top mirror 168 may include a top reflector layer of compact emitter 150. For example, top mirror 168 may include a DBR.

Isolation material 166 may include a material that provides electrical isolation. For example, isolation material 166 may include an ion implanted material, such as an H implanted material or a Hydrogen/Proton implanted material. In some implementations, isolation material 166 may define implant isolation layer 152 (e.g., a layer providing electrical isolation). At example cross-section 200, implant isolation layer 152 extends approximately to an outside edge of P-Ohmic metal layer 154.

Dielectric passivation/mirror layer 164 may include a layer that acts as a protective passivation layer and that acts as an additional DBR. For example, dielectric passivation mirror layer may include one or more sub-layers (e.g. a $SiO_2$ layer, a Si₃N₄ layer) deposited (e.g. via chemical vapor deposition) on one or more other layers of compact emitter 150.

Due to the split architecture of compact emitter 150, dielectric passivation/mirror layer 164 may not include any dielectric openings 156 at example cross-section 200. In other words, no dielectric via openings 156 are present at example cross-section 200. As described below with regard to FIG. 2B, dielectric passivation/mirror layer 164 may include one or more dielectric via openings 156 that provide electrical access to P-Ohmic metal layer 154. Optical aperture 158 may include a portion of dielectric passivation/mirror layer 164 over oxidation aperture 160 via which light may be emitted.

P-Ohmic metal layer 154 may include a layer that makes electrical contact via which electrical current may flow. For example, P-Ohmic metal layer 154 may include a TiAu layer, a TiPtAu layer, or the like, via which electrical current may flow (e.g., via a bondpad (not shown) that contacts P-Ohmic metal layer 154 through dielectric via openings 156).

Figure 2B:
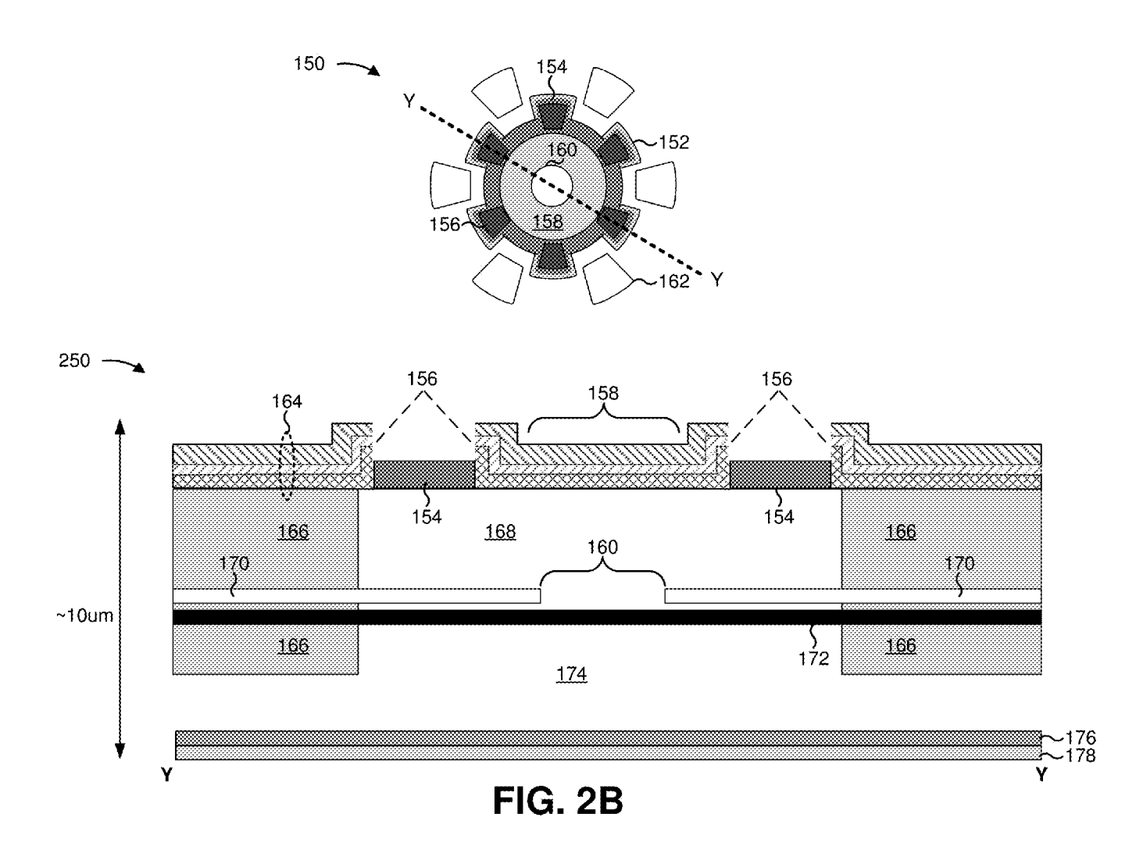

As shown in FIG. 2B, cross-sectional view 250 may represent a cross-section of compact emitter 150 that passes through a pair of dielectric via openings 156 (e.g., as shown by the line labeled "Y-Y"). Backside cathode layer 178, substrate layer 176, bottom mirror 174, active region 172, oxidation layer 170 (e.g., including oxidation aperture 160), top mirror 168, isolation material 166, dielectric passivation/mirror layer 164 (e.g., including optical aperture 158) may be arranged in a manner similar to that described with regard to example cross-section 200.

As shown, no oxidation trenches 162 are present at cross-section 250. However, as shown, dielectric passivation/mirror layer 164 may include a pair of dielectric openings 156 at example cross-section 250. Thus, P-Ohmic metal layer 154 may be contacted (e.g., by a bondpad) through dielectric via openings 156 at example cross-section 250. As shown, P-Ohmic metal layer 154 may be wider at cross-section 250 than at cross-section 200.

In some implementations, compact emitter 150 may be manufactured using a series of procedures. For example, one or more layers of compact emitter 150 may be created using one or more growth procedures, one or more deposition procedures, one or more etching procedures, one or more oxidation procedures, one or more implantation procedures, one or more metallization procedures, or the like.

The number, arrangement, thicknesses, order, symmetry, or the like, of layers shown in FIGS. 2A and 2B are provided as an example. In practice, compact emitter 150 may include additional layers, fewer layers, different layers, differently constructed layers, or differently arranged layers than those shown in FIGS. 2A and 2B. Additionally, or alternatively, the oxidation trenches 162 and corresponding "teeth" of the other layers may be unevenly spaced. Additionally, or alternatively, a set of layers (e.g., one or more one or more layers) of compact emitter 150 may perform one or more functions described as being performed by another set of layers of compact emitter 150.

Figure 3:
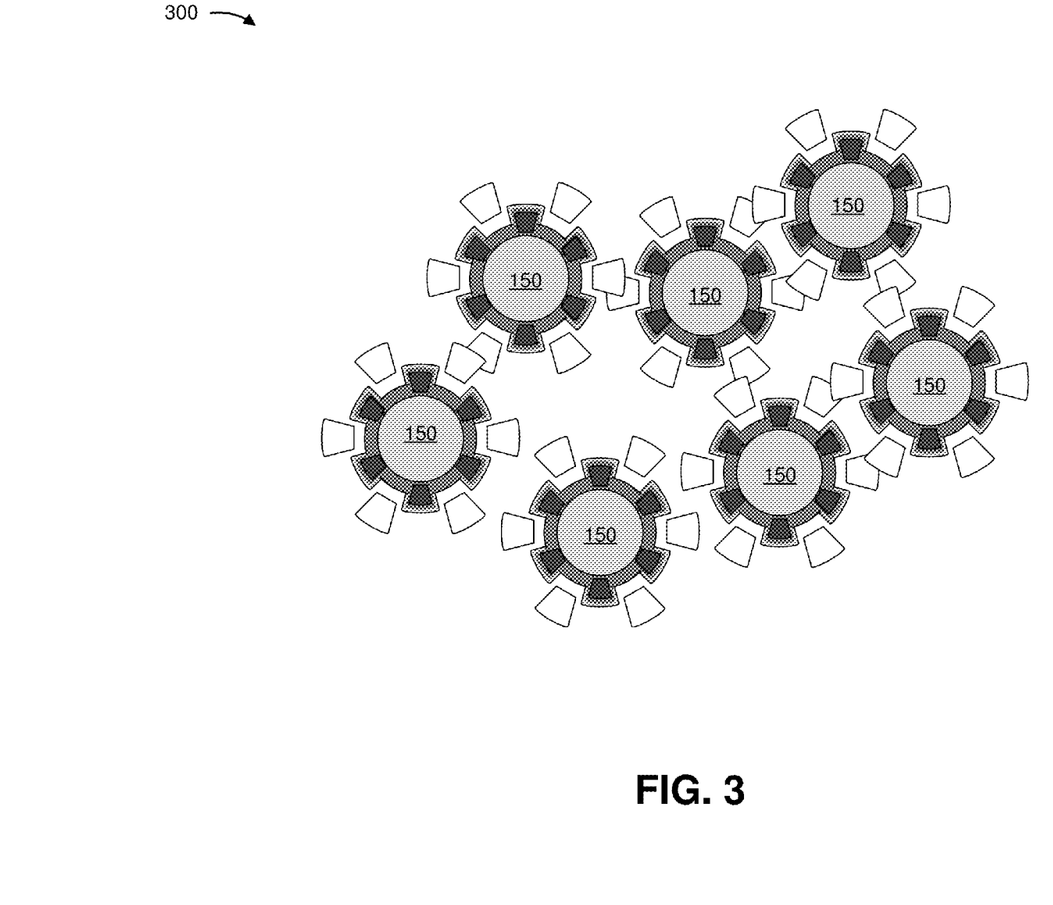
FIG. 3 is a diagram depicting a top-view of an example non-grid VCSEL array constructed using compact emitters.

FIG. 3 is a diagram depicting a top-view of a non-grid VCSEL array 300 constructed using compact emitters 150. As shown in FIG. 3, multiple compact emitters 150 may be constructed in a non-grid array. For example, as shown, multiple compact emitters 150 may be arranged at non-uniform distances and/or angles with respect to each other. As shown, in some implementations, a first oxidation trench 162, associated with a first compact emitter 150, may overlap (e.g., partially, fully, etc.) with a second oxidation trench 162 associated with a second compact emitter 150 that is adjacent to the first compact emitter 150. Overlap of the first oxidation trench 162 and the second oxidation trench 162 may not affect operation of the first compact emitter 150 or the second compact emitter 150 (while still allowing for reduced emitter spacing).

As illustrated in FIG. 3, due to the use of the split architecture or interdigitized design of compact emitter 150, spacing between compact emitters 150 of non-grid VCSEL array 300 may be reduced (e.g., as compared to spacing between a non-grid VCSEL array including emitters 100). As such, a size and/or a cost of an IC, on which a non-grid VCSEL array 300 is manufactured, may be reduced.

The number and arrangement of compact emitters 150 of non-grid VCSEL array 300 shown in FIG. 3 are provided as an example. In practice, non-grid VCSEL array 300 may include additional compact emitters 150, fewer compact emitters 150, or differently arranged compact emitters 150 than those shown in FIG. 3. In some embodiments, a VCSEL array may include a combination of compact emitters 150 and emitters 100.

Figure 4A:
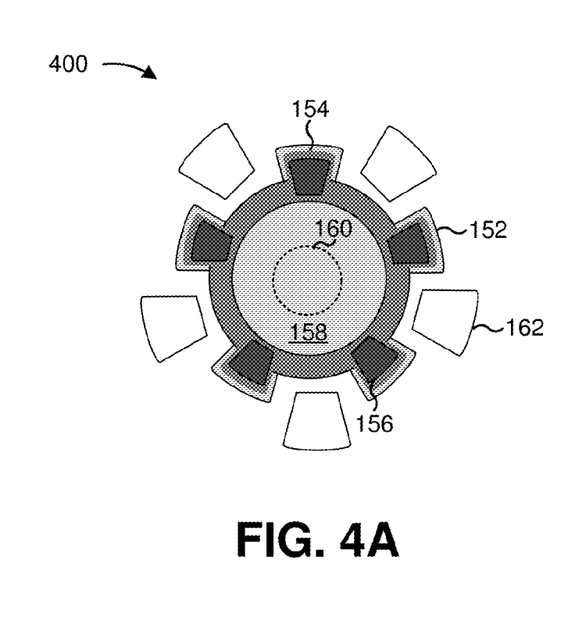
FIGS. 4A and 4B are diagrams depicting top-views of additional example designs for compact emitters.
Figure 4B:
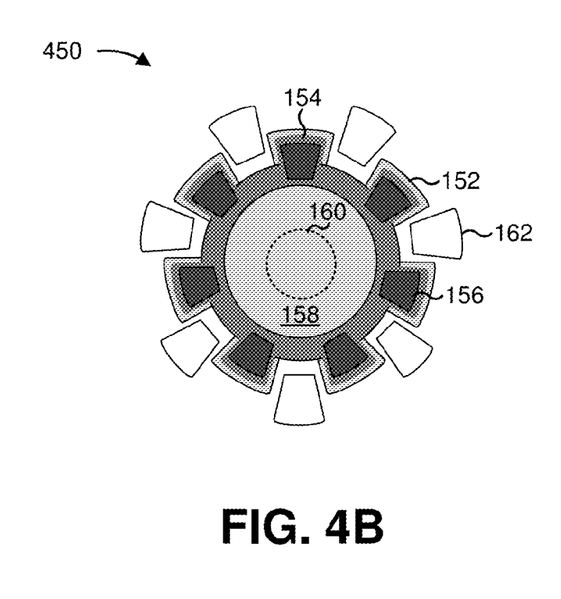

FIGS. 4A and 4B are diagrams depicting additional example designs for compact emitters 400 and 450, respectively. As described above, compact emitter 150 may include a set of six oxidation trenches 162 interdigitized with a set of six "tooth" structures that each include an extended portion of implant isolation layer 152, an extended portion of P-Ohmic metal layer 154, and a dielectric via opening 156. However, in some implementations, a compact emitter 150 may include a different number of oxidation trenches 162 and a corresponding set of "tooth" structures.

For example, as shown in FIG. 4A, compact emitter 400 may include a set of five oxidation trenches 162 interdigitized with a set of five "tooth" structures that each includes an extended portion of implant isolation layer 152, an extended portion of P-Ohmic metal layer 154, and a dielectric via opening 156. Similarly, as shown in FIG. 4B, compact emitter 450 may include a set of seven oxidation trenches 162 interdigitized with a set of seven "tooth" structures that each includes an extended portion of implant isolation layer 152, an extended portion of P-Ohmic metal layer 154, and a dielectric via opening 156.

Other implementations are possible that include a different number of oxidation trenches 162 and a different number of "tooth" structures. In other words, as indicated above, FIGS. 4A and 4B are provided merely as examples, and other examples are possible and may differ from what was described with regard to FIGS. 4A and 4B.

Figure 5A:
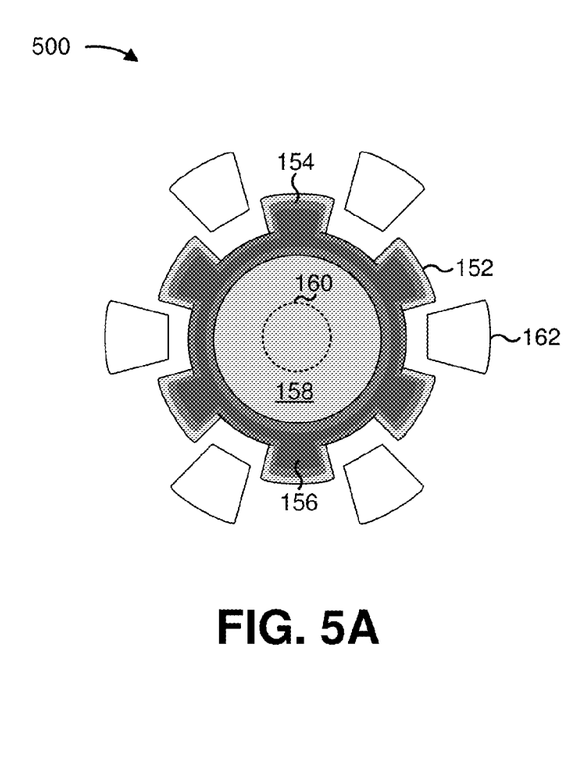
FIGS. 5A and 5B are diagrams depicting top-views of additional example design for compact emitters.
Figure 5B:
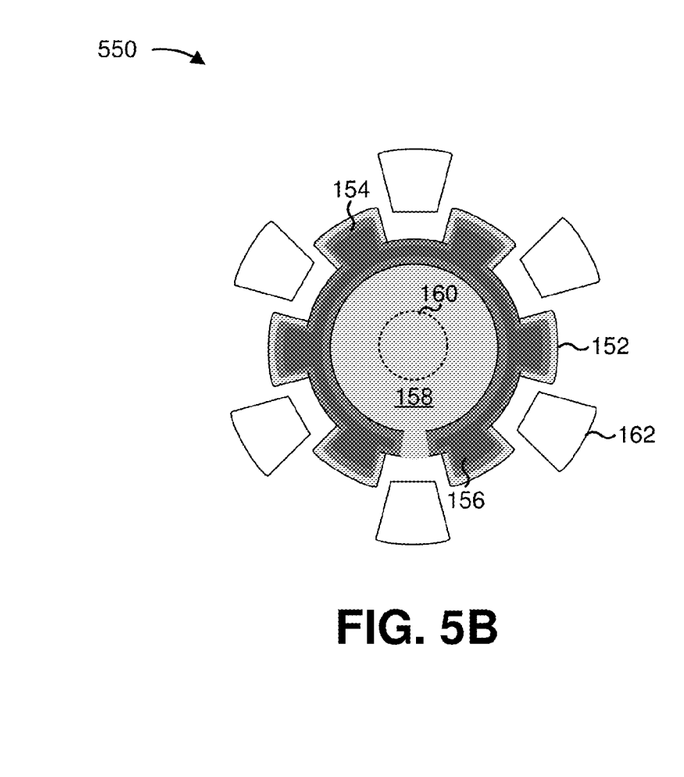

FIGS. 5A and 5B are diagrams depicting additional example designs for compact emitters 500 and 550, respectively. As described above, compact emitter 150 may include a set of disconnected dielectric via openings 156 that allow access to P-Ohmic metal layer 154. However, in some implementations, two or more dielectric via openings 156 of a compact emitter 150 may be connected.

For example, as shown in FIG. 5A, compact emitter 500 may include a set of six dielectric via openings 156 that are connected via arcuate segments between each pair of adjacent dielectric via openings 156 (e.g., such that dielectric via openings 156 of compact emitter 150 form a full ring-shape). Similarly, as shown in FIG. 5B, compact emitter 550 may include a set of six dielectric via openings 156 that are connected via arcuate segments between all but one pair of dielectric via openings 156 (e.g., such that dielectric via openings 156 of compact emitter 150 form a partial ring-shape).

Other implementations are possible that include a different arrangement of connected dielectric via openings 156. For example, a different number (e.g., two, three, four, five) of dielectric via openings 156 of compact emitter 150 may be connected. In some implementations, two or more oxidation trenches 162 of compact emitter 150 may be connected (e.g., via an arcuate segments between the two or more oxidation trenches 162) In other words, as indicated above, FIGS. 5A and 5B are provided merely as examples, and other examples are possible and may differ from what was described with regard to FIGS. 5A and 5B.

Additionally or alternatively, the circumferential spacing and/or radial spacing of the tooth structures and oxidation trenches may be unequal. In FIGS. 2A, 2B, 4A, 4B, 5A, and 5B, each tooth or trench in the sets of tooth structures and the set oxidation trenches were equally spaced relative to other members of the respective set; however unequal or uneven circumferential or radial spacing is also possible, even if such configurations may not provide the most optimal emitter performance.

Additionally or alternatively, the size or shape of each tooth or trench in the sets of tooth structures and the set of oxidation trenches may be different relative to other members of the respective set. In FIGS. 2A, 2B, 4A, 4B, 5A, and 5B each tooth or trench in their respective sets are illustrated having the same size and shape; however different sizes or shapes are also possible, even if such configurations may not provide the most optimal emitter performance.

Implementations described herein provide a compact emitter design that has a smaller size (e.g., as compared to equivalent emitters of a prior emitter design) and may allow spacing between emitters of a VCSEL array to be reduced (e.g., as compared to a VCSEL array using emitters of a prior emitter design), thereby allowing for increased emitter density within the VCSEL array. The reduction in emitter spacing may be achieved by using a split architecture for one or more emitter layers that allows space between oxidation trenches to be utilized by causing the one or more emitter layers to be interdigitized with the oxidation trenches. As such, a size of the emitter may be reduced (e.g., by approximately 20% as compared to a prior emitter design), thereby allowing for increased emitter density in a non-grid VCSEL array. Moreover, the compact emitter design may allow for increased emitter density while achieving a same level of performance as compared to the prior emitter design. In other words, the compact emitter design allows for the size of emitters to be reduced while maintaining a same performance level (e.g., in terms of an output power, wavelength, emission profile, reliability, etc.) as compared to the prior emitter design.

Additionally, alignment tolerances between emitter layers and/or minimum widths of the emitter layers may not be affected by use of the split architecture, which may preserve manufacturing and/or design considerations associated with the emitter. In other words, widths of and/or spacing between emitter layers may be the same as corresponding widths and spacing of the prior emitter design. This may allow the compact emitter to have performance characteristics that match performance characteristics of the prior emitter, as described above, while allowing a size of the emitter to be reduced and an array density to be increased.

The foregoing disclosure provides illustration and description, but is not intended to be exhaustive or to limit the implementations to the precise form disclosed. Modifications and variations are possible in light of the above disclosure or may be acquired from practice of the implementations.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A vertical cavity surface emitting laser (VCSEL), comprising:
   an implant isolation layer including a circular portion with a first radius and a first plurality of extended portions extending from a circumference of the circular portion;
   a P-Ohmic metal layer including a ring portion with a second radius and a second plurality of extended portions extending from a circumference of the ring portion,
      the P-Ohmic metal layer being formed on the implant isolation layer such that the second plurality of extended portions is positioned over the first plurality of extended portions of the implant isolation layer;
   a plurality of dielectric via openings formed on a dielectric via layer,
      a dielectric via opening, of the plurality of dielectric via openings, being positioned over a first extended portion, of the first plurality of extended portions, and a first extended portion of the second plurality of extended portions; and
   a plurality of oxidation trenches,
      an oxidation trench, of the plurality of oxidation trenches, being positioned at least partially between the first extended portion, of the first plurality of extended portions, and a second extended portion of the first plurality of extended portions.

2. The VCSEL of claim 1, where a width of the VCSEL is approximately equal to 32.4 micrometers.

3. The VCSEL of claim 1, where a quantity of the first plurality of extended portions matches a quantity of the second plurality of extended portions, a quantity of the plurality of dielectric via openings, and a quantity of the plurality of oxidation trenches.

4. The VCSEL of claim 1, where two or more of the plurality of dielectric via openings are connected to form a partial ring-shape.

5. The VCSEL of claim 1, where the plurality of oxidation trenches are formed in a partial ring-shape.

6. The VCSEL of claim 1, where the first radius, associated with the implant isolation layer, is approximately less than or equal to the second radius associated with the P-Ohmic metal layer.

7. The VCSEL of claim 1, where the first plurality of extended portions, the second plurality of extended portions, and the plurality of dielectric via openings are approximately equally spaced around the circumference of the circular portion.

8. A surface emitting laser, comprising:
an isolation layer including a first center portion and a first plurality of outer portions extending from a circumference of the first center portion;
a metal layer including a second center portion and a second plurality of outer portions extending from a circumference of the second center portion,
the metal layer being formed on the isolation layer such that a first outer portion, of the second plurality of outer portions, is formed over one of the first plurality of outer portions;
a passivation layer including a plurality of openings,
an opening, of the plurality of openings, being formed over the first outer portion of the second plurality of outer portions; and
a plurality of oxidation trenches,
an oxidation trench, of the plurality of oxidation trenches, being positioned at least partially between the first outer portion, of the second plurality of outer portions, and a second outer portion of the second plurality of outer portions,
the first outer portion being adjacent to the second outer portion.

9. The surface emitting laser of claim 8, where each outer portion, of the second plurality of outer portions is formed over one of the first plurality of outer portions or each opening, of the plurality of openings, is formed over one of the second plurality of outer portions.

10. The surface emitting laser of claim 8, where a quantity of the first plurality of outer portions matches a quantity of the second plurality of outer portions, a quantity of the plurality of openings, or a quantity of the plurality of oxidation trenches.

11. The surface emitting laser of claim 10, where the quantity of the first plurality of outer portions includes five outer portions, six outer portions, or seven outer portions.

12. The surface emitting laser of claim 8, where the plurality of oxidation trenches are formed in an irregular shape.

13. The surface emitting laser of claim 8, where two or more of the plurality of openings or two or more of the plurality of oxidation trenches are connected.

14. The surface emitting laser of claim 8, where the first plurality of outer portions, the second plurality of outer portions, and the plurality of openings are approximately equally spaced around the circumference of the first center portion.

15. A laser array, comprising:
a plurality of vertical cavity surface emitting lasers (VCSELs),
each of the plurality of VCSELs having an oxidation aperture size of approximately six micrometers to fourteen micrometers, and
a VCSEL, of the plurality of VCSELs, includes an isolation layer, including a circular portion and a first plurality of extended portions extending outward from and around the circular portion, and an oxidation trench at least partially positioned between a first extended portion, of the first plurality of extended portions, and a second extended portion of the first plurality of extended portions.

16. The laser array of claim 15, where the VCSEL, of the plurality of VCSELs, further includes:
a metal layer including a ring portion and a second plurality of extended portions extending from the ring portion,
the metal layer being formed on the isolation layer such that the second plurality of extended portions is positioned over the first plurality of extended portions;
a plurality of dielectric via openings,
a dielectric via opening, of the plurality of dielectric via openings, being positioned over the first extended portion, of the first plurality of extended portions, and a first extended portion of the second plurality of extended portions; and
a plurality of oxidation trenches,
the plurality of oxidation trenches including the oxidation trench.

17. The laser array of claim 16, where a quantity of the first plurality of extended portions matches a quantity of the second plurality of extended portions, a quantity of the plurality of dielectric via openings, and a quantity of the plurality of oxidation trenches.

18. The laser array of claim 16, where the VCSEL, of the plurality of VCSELs, does not share any oxidation trench, of the plurality oxidation trenches, with another VCSEL of the plurality of VCSELs.

19. The laser array of claim 15, where each VCSEL, of the plurality of VCSELS, has a width that is less than 40 micrometers.

20. The laser array of claim 15, where the laser array is a non-grid VCSEL array.

* * * * *